United States Patent
Iwakata et al.

(10) Patent No.: US 6,718,223 B1
(45) Date of Patent: Apr. 6, 2004

(54) METHOD OF PROCESSING SEMICONDUCTOR WAFER AND SEMICONDUCTOR WAFER SUPPORTING MEMBER

(75) Inventors: Yuichi Iwakata, Warabi (JP); Hayato Noguchi, Urawa (JP); Katsuhisa Taguchi, Koshigaya (JP); Kazuyoshi Ebe, Shiraoka-machi (JP)

(73) Assignee: Lintec Corporation, Tokyo (JP)

( * ) Notice: Subject to any disclaimer, the term of this patent is extended or adjusted under 35 U.S.C. 154(b) by 0 days.

(21) Appl. No.: 09/573,463

(22) Filed: May 17, 2000

(30) Foreign Application Priority Data

May 18, 1999 (JP) ............................................ 11/136993

(51) Int. Cl.[7] .......................... G06F 19/00; H01L 21/00
(52) U.S. Cl. ......................... 700/121; 700/116; 438/5
(58) Field of Search .................... 700/112, 115, 700/116, 215, 225, 121; 438/5

(56) References Cited

U.S. PATENT DOCUMENTS

| | | | | |
|---|---|---|---|---|
| 4,450,024 A | * | 5/1984 | Haghiri-Tehrani et al. | 156/108 |
| 4,588,880 A | * | 5/1986 | Hesser | 235/376 |
| 5,166,884 A | * | 11/1992 | Maney et al. | 700/113 |
| 5,389,769 A | | 2/1995 | Yamashita et al. | 235/375 |
| 5,570,293 A | * | 10/1996 | Tanaka et al. | 700/121 |
| 5,668,056 A | | 9/1997 | Wu et al. | 438/106 |
| 5,756,379 A | * | 5/1998 | Haghiri-Tehrani | 438/126 |
| 5,787,174 A | * | 7/1998 | Tuttle | 713/189 |
| 5,888,838 A | * | 3/1999 | Mendelson et al. | 438/15 |
| 5,976,199 A | | 11/1999 | Wu et al. | 29/25.01 |
| 6,056,199 A | * | 5/2000 | Wiklof et al. | 235/462.45 |
| 6,147,604 A | * | 11/2000 | Wiklof et al. | 340/572.1 |
| 6,330,971 B1 | * | 12/2001 | Mabry et al. | 235/383 |
| 6,393,045 B1 | * | 5/2002 | Belcher et al. | 375/130 |
| 6,404,643 B1 | * | 6/2002 | Chung | 361/737 |

FOREIGN PATENT DOCUMENTS

| | | |
|---|---|---|
| EP | 0157508 | 10/1985 |
| JP | 60196956 | 10/1985 |
| JP | 60223139 | 11/1985 |
| JP | 61260619 | 11/1986 |
| JP | 2-069958 | 3/1990 |
| JP | 4-146649 | 5/1992 |
| JP | 5-032946 | 2/1993 |
| JP | 7-279782 | 10/1995 |
| JP | 08027239 | 1/1996 |
| JP | 09007977 | 1/1997 |

* cited by examiner

*Primary Examiner*—Leo Picard
*Assistant Examiner*—Paul Rodriguez
(74) *Attorney, Agent, or Firm*—Webb Ziesenheim Logsdon Orkin & Hanson, P.C.

(57) ABSTRACT

A method of processing a semiconductor wafer. The wafer is secured to a wafer supporting member having a data carrier. Information required for working the semiconductor wafer is input to the data carrier. The wafer is then worked according to information read from the data carrier. The data carrier is configured to permit operations such as back grinding, dicing and pickup of the wafer, and prevents wafer breakage when the wafer is carried between different operations.

9 Claims, 3 Drawing Sheets

METHOD OF PROCESSING SEMICONDUCTOR WAFER AND SEMICONDUCTOR WAFER SUPPORTING MEMBER

FIELD OF THE INVENTION

The present invention relates to a method of processing a semiconductor wafer and to a semiconductor wafer supporting member which is suitably used in the method.

BACKGROUND OF THE INVENTION

In recent years, in the semiconductor manufacturing process, there has been a trend towards manufacturing a larger variety of items in smaller lots. Thus, working conditions vary depending on individual wafers, and accordingly a process control must be effected in conformity with each individual variety and each individual lot. Furthermore, it is required to control information on the level of quality, for example, rating as Excellent, Good, Fair or Failure, with respect to each individual circuit (chip) formed on wafers.

The method known as the "bar code method" is employed in order to effect such a process control or quality control. In the bar code method, the serial number carved on a surface of a wafer is transcribed in a bar code onto a bar code label, and the bar code label is then attached to a wafer supporting member. On the other hand, various information regarding the wafer is registered in a host computer in correspondence with the serial number of the wafer. At each step of the semiconductor wafer processing, information required for the control of the step is retrieved from the host computer with reference to the serial number, and the necessary operation is carried out on the basis of the retrieved information.

A detailed description of the process control for semiconductor wafer working in accordance with the above bar code method is found in, for example, Japanese Patent Laid-open Publication Nos. 4(1992)-146649 and 9(1997)-7977.

In this bar code method, the host computer for information control must control all information regarding the wafers, so that the problem occurs that the load on the host computer is extreme. Moreover, generally, all steps of wafer processing are not necessarily carried out in one plant, and wafers are transported from one plant to another plant in order to continue the processing thereof. All information regarding the wafer is registered in the host computer of one plant. Therefore, when wafers are transported from one plant to another, it is necessary to access the host computer of one plant from another plant to retrieve necessary information, or the information registered in the host computer must be memorized in an information recording medium and transported together with the wafers to another plant where the information regarding the wafers is registered in a host computer of another plant again. Therefore, the process control becomes laborious.

The present invention has been made in view of the above state of the prior art. Therefore, it is an object of the present invention to construct a process control system for semiconductor manufacturing which enables reducing the load on a host computer and which facilitates an information control even if wafers are transported between plants.

SUMMARY OF THE INVENTION

The method of processing a semiconductor wafer according to the present invention comprises the steps of:

securing a semiconductor wafer on which circuits are formed to a semiconductor wafer supporting member having a data carrier;

inputting information required for semiconductor wafer working in the data carrier; and reading the information from the data carrier and working the semiconductor wafer in accordance with the read information.

In this semiconductor wafer processing method, preferably, the working of the semiconductor wafer is at least one selected from among grinding the semiconductor wafer at its back, dicing the semiconductor wafer and picking up semiconductor chips produced by the dicing.

The semiconductor wafer supporting member of the present invention is suitable for use in the above semiconductor wafer processing method and comprises a data carrier.

For example, the semiconductor wafer supporting member of the present invention can be:

a first semiconductor wafer supporting member comprising a hard plate having the data carrier secured thereupon;

a second semiconductor wafer supporting member comprising a hard plate having the data carrier buried therein;

a third semiconductor wafer supporting member comprising a ring frame having the data carrier secured thereupon; or a fourth semiconductor wafer supporting member comprising a ring frame and a pressure sensitive adhesive sheet provided so that the pressure sensitive adhesive sheet is spread by the ring frame, wherein the pressure sensitive adhesive sheet has the data carrier stuck thereonto.

With respect to the semiconductor wafer supporting member of the present invention, it is preferred that information regarding the condition of supported semiconductor wafer, the quality of circuits formed on a surface of semiconductor wafer and the data required for a process control of semiconductor wafer working be memorized in the data carrier.

In accordance with the present invention, information required for a process control for semiconductor wafer working is memorized in the data carrier of the semiconductor wafer supporting member, so that the load on a host computer is reduced and further, when wafers are transferred between plants, requisite information is transferred together with the wafers to thereby facilitate controlling the information therefor.

DETAILED DESCRIPTION OF THE INVENTION

Figure 1:
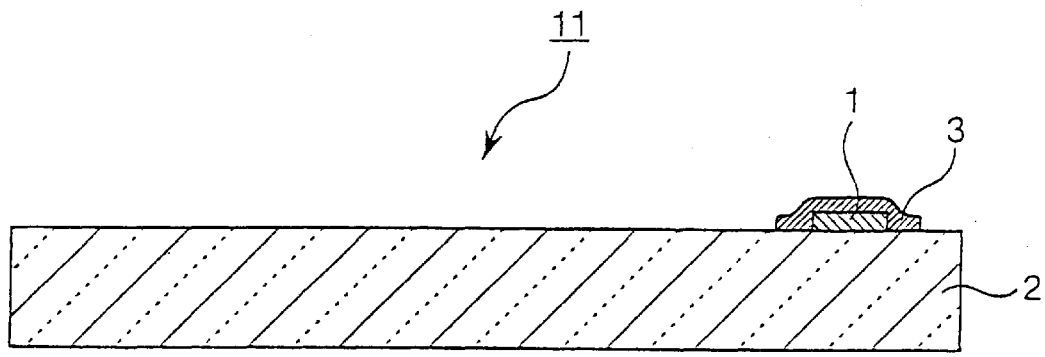
FIG. 1 is a sectional view of the first semiconductor wafer supporting member of the present invention.

The present invention will be described in greater detail below with reference to the appended drawings.

As aforementioned, the method of processing a semiconductor wafer according to the present invention comprises the steps of:

(1) securing a semiconductor wafer on which circuits are formed to a semiconductor wafer supporting member having a data carrier (hereinafter referred to as "wafer securing step (1)");

(2) inputting information required for semiconductor wafer working in the data carrier (hereinafter referred to as "information inputting step (2)"); and (3) reading the information from the data carrier and working the semiconductor wafer in accordance with the read information (hereinafter referred to as "working step (3)").

Conventional silicon and gallium arsenide semiconductor wafers and the like can be used as the semiconductor wafer. However, the semiconductor wafer for use in the present invention is not limited thereto, and various semiconductor wafers can be employed.

The formation of circuits on a wafer surface can be accomplished by various methods including customary processes such as the etching process and the lift-off process. In these methods, an oxide layer may be formed on the back of the wafer. This oxide layer is removed by grinding the back of the wafer as described later.

In the wafer securing step (1), the semiconductor wafer having circuits formed thereon is secured to a semiconductor wafer supporting member of the present invention. This semiconductor wafer supporting member comprises a data carrier. Details thereof will be described later.

The means for securing the wafer to the supporting member is not particularly limited, and the securing of the wafer can be effected by various conventional means. The securing of the wafer to the first and second semiconductor wafer supporting members described later can be accomplished by the use of, for example, a wax or a pressure sensitive adhesive double coated sheet. In the present invention, it is especially preferred to employ a pressure sensitive adhesive double coated sheet which comprises a shrinkable base material and, superimposed on both surfaces thereof, pressure sensitive adhesive layers.

Heat shrinkable films can preferably be used as the shrinkable base material. Examples thereof include monoaxially or biaxially oriented films of, for example, polyethylene terephthalate, polyethylene, polystyrene, polypropylene, nylon, urethane, polyvinylidene chloride and polyvinyl chloride.

The thickness of these shrinkable films is generally in the range of 5 to 300 $\mu$m, preferably 10 to 200 $\mu$m.

The shrinkable film may have a monolayer structure consisting of a single shrinkable film selected from those set forth above or a laminate structure consisting of a plurality of shrinkable films selected from among those set forth above. When the shrinkable film has a laminate structure, it is preferred that the laminate consist of films whose shrinkage factors are different from each other. The use of the laminate consisting of films whose shrinkage factors are different from each other as the base material promotes the deformation of the base material by the shrinkage. The pressure sensitive adhesive sheet per se is deformed in accordance with the shrinkage of the base material, so that the area of contact to the wafer (chips) with the pressure sensitive adhesive sheet is decreased. As a result, the adhesive strength with the wafer (chips) is also decreased, thereby enabling the easy performance of chip pickup as described later.

The shrinkable film used as the base material may be furnished with a multiplicity of minute cuts.

When such cuts are provided, the pickup of each chip can be facilitated.

In the pressure sensitive adhesive double coated sheet usable in the present invention, it is preferred that either or both of the pressure sensitive adhesive layers be composed of an energy radiation curable pressure sensitive adhesive. In particular, it is preferred that the pressure sensitive adhesive layer on the side to which the wafer is stuck be composed of an energy radiation curable pressure sensitive adhesive.

The energy radiation curable pressure sensitive adhesive generally contains an acrylic pressure sensitive adhesive and an energy radiation polymerizable compound as principal components thereof.

Detailed description of this energy radiation curable pressure sensitive adhesive is found in, for example, Japanese Patent Laid-open Publication Nos. 60(1985)-196,956 and 60(1985)-223,139.

The layer of energy radiation curable pressure sensitive adhesive may be composed of an energy radiation curable copolymer having an energy radiation polymerizable group at its side chain. This energy radiation curable copolymer has properties exhibiting both pressure sensitive adherence and energy radiation curability. Detailed description of the energy radiation curable copolymer having an energy radiation polymerizable group at its side chain is found in, for example, Japanese Patent Laid-open Publication Nos. 5(1993)-32946 and 8(1996)-27239.

The above acrylic energy radiation curable pressure sensitive adhesive exhibits satisfactory adhesive strength to the wafer (chips) before the irradiation with energy radiation, which adhesive strength markedly decreases after the irradiation with energy radiation. That is, the wafer (chips) is held with satisfactory adhesive strength before the irradiation with energy radiation, but, after the irradiation with energy radiation, the adhesive strength is decreased to thereby enable easily separating the obtained chips.

The pressure sensitive adhesive layer, other than the layer of energy radiation curable pressure sensitive adhesive, can be formed from various conventional pressure sensitive adhesives. These pressure sensitive adhesives, although not limited thereto at all, can be, for example, repeelable pressure sensitive adhesives based on a rubber, an acrylic, a silicone, a polyurethane, polyvinyl ether or the like. However, in the present invention, it is especially preferred that the pressure sensitive adhesive layers on both sides of the sheet be composed of the above energy radiation curable pressure sensitive adhesives.

The thickness of each of the pressure sensitive adhesive layers, although depending on the type of material used therein, is generally in the range of 3 to 100 $\mu$m, preferably 10 to 50 $\mu$m.

In the third semiconductor wafer supporting member, the securing of the wafer can be effected by the pressure sensitive adhesive sheet spread by the ring frame. This pressure sensitive adhesive sheet can be any of those described in, for example, Japanese Patent Laid-open Publication Nos. 60(1985)-196956 and 8(1996)-27239.

The fourth semiconductor wafer supporting member per se described later has a pressure sensitive adhesive sheet functioning as means for securing the wafer. This pressure sensitive adhesive sheet can be the same as employed in the third semiconductor wafer supporting member.

In the information inputting step (2), information regarding the condition of the semiconductor wafer and the level of quality of each individual circuit and information regarding the data required for a process control are inputted in the data carrier. The terminology "condition of semiconductor wafer" used herein means, for example, the semiconductor wafer thickness, thickness accuracy, presence of flaw in the semiconductor wafer, etc., and this information can be utilized in the step of grinding the back of the semiconductor wafer as described later. Further, for example, information regarding the number of circuits, circuit size, distance between circuits, etc. can be utilized in the step of dicing the semiconductor wafer as described later. The level of quality of each individual circuit refers to, for example, the drivability and durability of each individual circuit, which is rated as Excellent, Good, Fair or Failure. This information can be utilized in the step of picking up semiconductor chips as described later. This ranking of each individual chip enables classifying and employing chips in conformity with the use, so that, for example, Excellent chips are mounted on high-grade products or products which are operated in a severe atmosphere and chips which are not Excellent but satisfactorily drivable are mounted on general-purpose products or products which are operated in a mild environment. Failure chips are excluded in the pickup step. The data required for a process control is, for example, information regarding the grinding amount, grinding speed, final wafer thickness, etc. in the step of grinding the back of the semiconductor wafer and information regarding the type of dicing blade, dicing speed, spacing between dicing lines, etc. in the step of dicing the semiconductor wafer. In the pickup step, it is information regarding the sites where chips are mounted in correlation with the level of quality of chips.

In place of the wafer securing step (1) followed by the information inputting step (2) as described above, the information inputting step (2) may be carried out prior to the wafer securing step (1).

Further, the information inputting step (2) may be performed a plurality of times in conformity with the advance of the process.

In the wafer working step (3), at least one selected from among all operations required for obtaining chips from the semiconductor wafer having circuits formed thereon, such as grinding the semiconductor wafer at its back, dicing the semiconductor wafer and picking up semiconductor chips produced by the dicing, is carried out. When these operations are carried out, the information required for each particular operation is retrieved from the data carrier in which the above information is memorized.

The step of grinding the back of the semiconductor wafer is one wherein an oxide layer formed on the back of the semiconductor wafer at the formation of circuits is removed and the semiconductor wafer is ground to a given thickness. At this step, not only information regarding the condition of semiconductor wafer, such as the semiconductor wafer thickness, thickness accuracy, presence of flaw, etc. prior to back grinding, but also the data required for a process control, such as the grinding amount, grinding speed, final wafer thickness, etc. at the time of back grinding, are read from the data carrier. The back grinding can be performed with the use of conventional means such as a grinder.

The step of dicing the semiconductor wafer is one wherein the semiconductor wafer is cut at every circuit to thereby obtain semiconductor chips. At this step, information regarding the condition of the formation of circuits formed on the surface of the semiconductor wafer, such as the number of circuits, circuit size, distance between circuits, etc. and data required for a process control, such as the type of dicing blade employed at the time of dicing, dicing speed, spacing between dicing lines, etc., are read from the data carrier. The dicing of the semiconductor wafer can be performed by the use of a conventional dicing apparatus. In the semiconductor wafer processing method of the present invention, at the step of dicing, it may occur that the circuit side is brought into contact with the semiconductor wafer supporting member to thereby disenable direct visual inspection of the state of the circuits. However, in this case as well, the dicing can be performed while inspecting the condition of the formation of circuits from the supporting member side by employing a transparent semiconductor wafer supporting member. Furthermore, when the semiconductor wafer is ground to an extremely small thickness, there are cases where the condition of the formation of circuits can be inspected from the back of the semiconductor wafer. Therefore, the dicing can be free from any trouble.

The step of picking up semiconductor chips formed by the dicing is one wherein semiconductor chips are separated from the semiconductor wafer supporting member and mounted on a given substrate such as a lead frame. At this step, information regarding the quality level of chips rated as Excellent, Good, Fair or Failure on the basis of the results of inspection of, for example, the drivability and durability of each individual circuit, and information required for a process control, such as the data regarding the sites where chips are mounted in correlation with the level of quality of circuits, are read from the data carrier.

In the semiconductor wafer processing method of the present invention, the semiconductor wafer is secured to the semiconductor wafer supporting member. Therefore, when a pressure sensitive adhesive double coated sheet which comprises a shrinkable base material and, superimposed on both surfaces thereof, pressure sensitive adhesive layers is used as the semiconductor wafer supporting member, the pressure sensitive adhesive double coated sheet is deformed by shrinking the base material to thereby reduce the area of contact between the chips and the pressure sensitive adhesive layer. Thus, the pickup of chips can be facilitated. Moreover, when the energy radiation curable pressure sensitive adhesive is used in the pressure sensitive adhesive layer, the pressure sensitive adhesive layer is cured by irradiating the pressure sensitive adhesive layer with energy radiation to thereby reduce the adhesive strength. Thus, the pickup of chips can be further facilitated.

The semiconductor wafer supporting member of the present invention will now be described in greater detail.

The semiconductor wafer supporting member of the present invention is suitable for use in the above semiconductor wafer processing method, and comprises the data carrier.

The terminology "data carrier" used herein means a device having a part in which information is memorized wherein information inputting and reloading are conducted and which transmits a response to a query from an interrogator with respect to the inputted information. In the present invention, preferred use is made of a noncontact data carrier capable of noncontact information inputting and outputting with the use of electromagnetic wave. A component comprising an IC chip and, connected thereto, a conductive coil, known as "RF memory", can be mentioned as the noncontact data carrier.

Specifically, the semiconductor wafer supporting member of the present invention can be:

the first semiconductor wafer supporting member comprising a hard plate having the data carrier secured thereupon;

the second semiconductor wafer supporting member comprising a hard plate having the data carrier buried therein;

the third semiconductor wafer supporting member comprising a ring frame having the data carrier secured thereupon; or the fourth semiconductor wafer supporting member comprising a ring frame and a pressure sensitive adhesive sheet provided so that the pressure sensitive adhesive sheet is spread by the ring frame, the pressure sensitive adhesive sheet having the data carrier stuck thereonto.

It is preferred that information regarding the condition of supported semiconductor wafer as mentioned above, the quality level of circuits formed on the surface of the semiconductor wafer and the data required for a process control for semiconductor wafer working be memorized in the data carrier.

The above varied forms of semiconductor wafer supporting members will be described more specifically below with reference to the appended drawings.

Referring to FIG. 1, the first semiconductor wafer supporting member 11 comprises hard plate 2 having data carrier 1 secured thereupon.

For example, a glass plate, a quartz plate or a plastic plate such as an acrylic plate, a polyvinyl chloride plate, a polyethylene terephthalate plate, a polypropylene plate or a polycarbonate plate can be used as the hard plate 2. The hardness (measured in accordance with ASTM D 883) of the plastic plate is preferably 70 MPa or higher. The thickness of the hard plate 2, although depending on the type of material used therein, is generally in the range of about 0.1 to 10 mm. When as aforementioned the pressure sensitive adhesive double coated sheet including the layer of energy radiation curable pressure sensitive adhesive is used in the securing of the semiconductor wafer and when ultraviolet light is used as the energy radiation, the hard plate 2 is formed from an ultraviolet permeable material.

The shape of the hard plate 2 is not particularly limited and can be, for example, any of a circle, a rectangle and a rectangle whose one side takes the form of a semicircle. However, it is requisite that the hard plate 2 be larger than the supported semiconductor wafer.

The semiconductor wafer is supported in a central part of the hard plate 2, and the data carrier 1 is secured on a peripheral part of the hard plate 2 so that the semiconductor wafer and the data carrier 1 are not piled one upon the other. The means for securing the data carrier 1 onto the hard plate 2 is not particularly limited, and the securing can be effected by common means such as an adhesive or a pressure sensitive adhesive double coated tape. Alternatively, the data carrier 1 can be directly formed on the hard plate 2 by the etching technique or printing technique.

In the first semiconductor wafer supporting member 11, it is preferred that protective sheet 3 be stuck onto the data carrier 1. The protective sheet can be, for example, a pressure sensitive adhesive sheet comprising a base material such as a polyethylene film or a polyethylene terephthalate film coated with a pressure sensitive adhesive. The thickness of the protective sheet is preferably in the range of about 10 to 200 μm. Further, in place of the use of the protective sheet, sealing with a resin such as an epoxy resin or a urethane resin can be conducted. At the time of grinding the back of the semiconductor wafer or dicing the semiconductor wafer, which is conducted while spraying water in order to remove grinding dust or grinding heat, the sticking of the protective sheet 3 enables protecting the data carrier 1 from the grinding dust and water.

Figure 2:
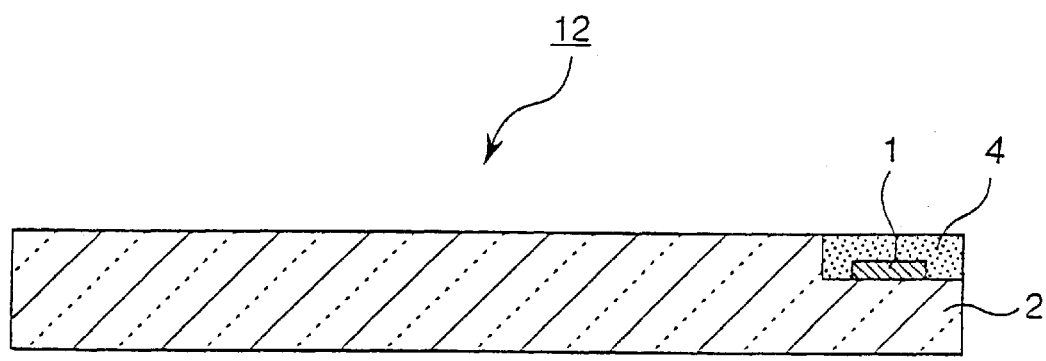
FIG. 2 is a sectional view of the second semiconductor wafer supporting member of the present invention.

Referring now to FIG. 2, the second semiconductor wafer supporting member 12 comprises hard plate 2 having data carrier 1 buried therein. The hard plate 2 is the same as mentioned above. In the construction of FIG. 2, a cut is provided at a part of the periphery of the hard plate 2. The data carrier 1 is disposed in the cut and sealed by resin 4.

Figure 3:
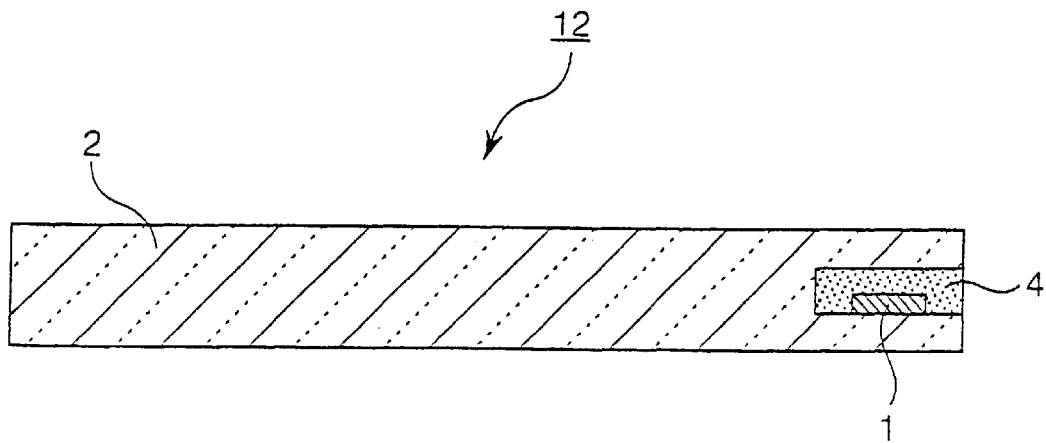
FIG. 3 is a sectional view of one form of modification of the second semiconductor wafer supporting member of the present invention.

Referring further to FIG. 3, a hole is provided from a side of the hard plate 2. The data carrier 1 is inserted in the hole and sealed by resin 4. Thus, the second semiconductor wafer supporting member 12 can be obtained.

Figure 4:
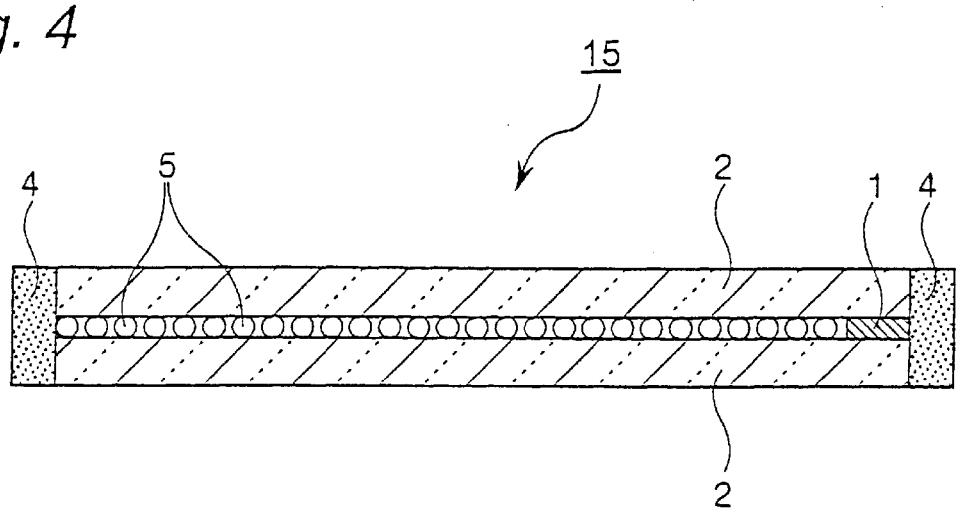
FIG. 4 is a sectional view of another form of modification of the second semiconductor wafer supporting member of the present invention.

Still further, referring to FIG. 4, two hard plates 2 are piled one upon the other with the data carrier 1 and spacers 5 of diameter equal to the thickness of the data carrier 1 interposed therebetween, and the periphery thereof is sealed by resin 4. Thus, the third semiconductor wafer supporting member 15 can be obtained.

When the semiconductor wafer is secured to the first or second semiconductor wafer supporting member with the use of a pressure sensitive adhesive double coated tape in such a manner that the circuit side of the semiconductor wafer is held on the semiconductor wafer supporting member, all the steps of grinding the back of the semiconductor wafer, dicing the semiconductor wafer and picking up semiconductor chips can be performed in the same configuration having the semiconductor wafer held by the semiconductor wafer supporting member.

Figure 5:
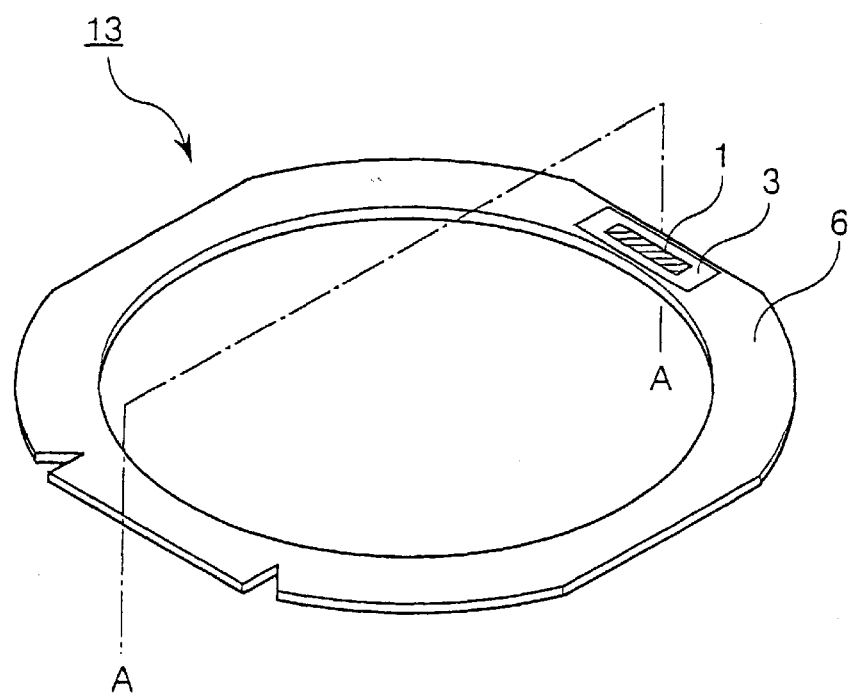
FIG. 5 is a sectional view and a perspective view of the third semiconductor wafer supporting member of the present invention.
Figure 5:

The third semiconductor wafer supporting member 13 comprises ring frame 6 having data carrier 1 secured thereupon, as shown in FIG. 5.

Figure 6:
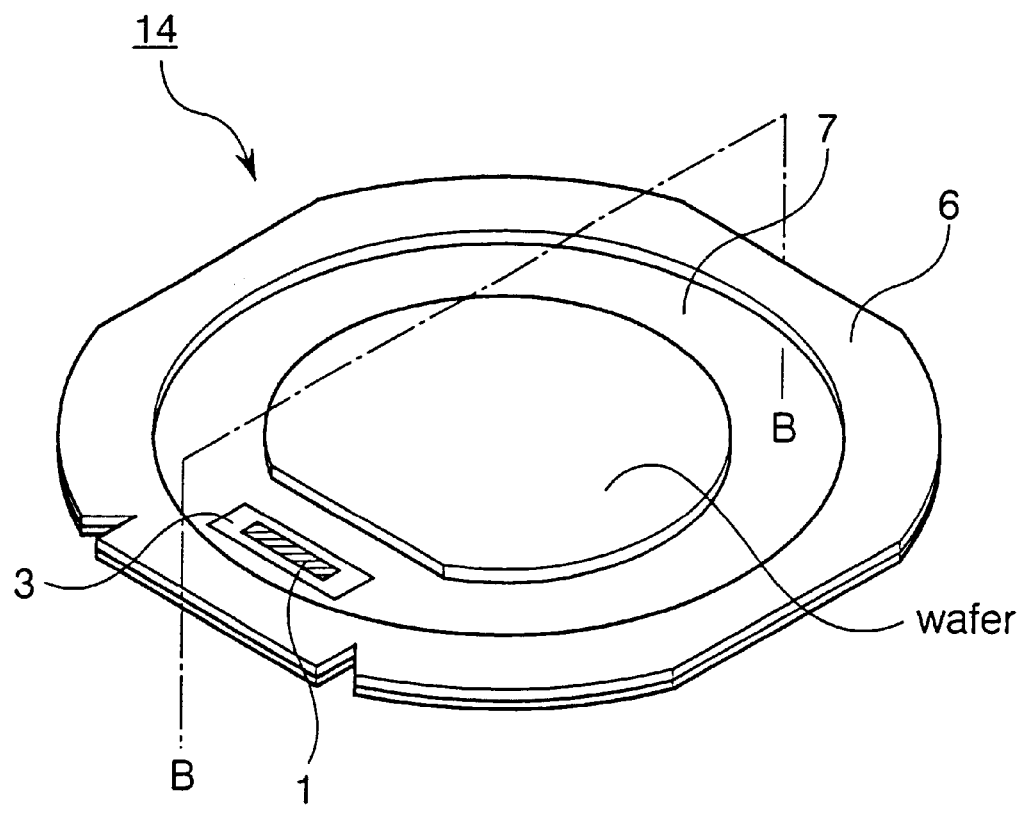
FIG. 6 is a sectional view and a perspective view of the fourth semiconductor wafer supporting member of the present invention.
Figure 6:
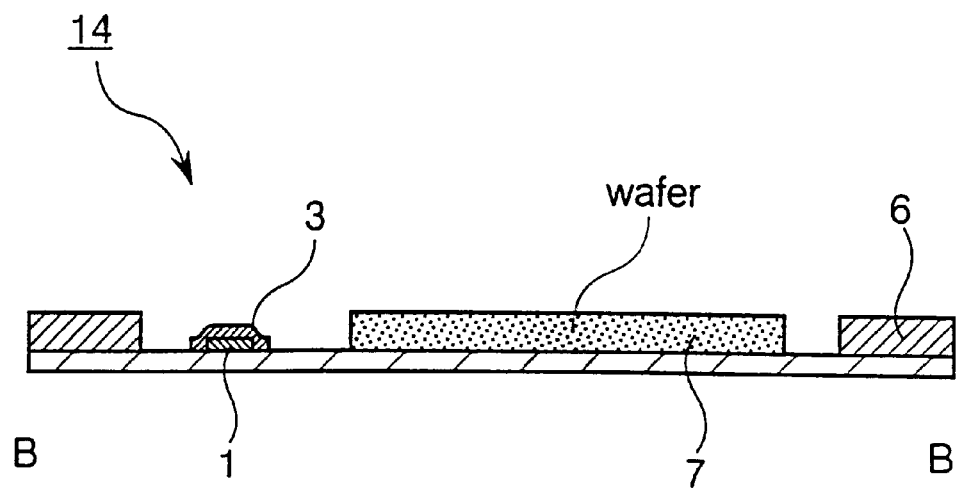

The fourth semiconductor wafer supporting member 14, referring to FIG. 6, comprises ring frame 6 and pressure sensitive adhesive sheet 7 provided so that the pressure sensitive adhesive sheet 7 is spread by the ring frame 6, the pressure sensitive adhesive sheet 7 having the data carrier 1 stuck thereonto.

In the third semiconductor wafer supporting member 13 and the fourth semiconductor wafer supporting member 14 as well, protective sheet 3 for protecting the data carrier 1 may be stuck onto the data carrier 1, or the data carrier 1 may be sealed with a resin, in the same manner as in the above first semiconductor wafer supporting member 11.

Although pressure sensitive adhesive sheets conventionally employed in the working of semiconductor wafer can be used without any particular limitation as the pressure sensitive adhesive sheet 7 spread by the ring frame 6 in the fourth semiconductor wafer supporting member 14, it is especially preferred in the present invention to employ a pressure sensitive adhesive sheet having a layer of energy radiation curable pressure sensitive adhesive. A detailed description of such an energy radiation curable pressure sensitive adhesive sheet is found in, for example, Japanese Patent Laid-open Publication Nos. 60(1985)-196956, 60(1985)-223139, 5(1993)-32946 and 8(1996)-27239.

As apparent from the foregoing, in the present invention, information required for a process control for semiconductor wafer working is memorized in the data carrier of the semiconductor wafer supporting member, so that the load on a host computer is reduced and further, when wafers are transferred between plants, requisite information is transferred together with the wafers to thereby facilitate controlling the information therefor.

Moreover, in the present invention, a series of back grinding, dicing and picking-up operations can be performed in the same configuration wherein the wafer (chip) is held on the supporting member to thereby facilitate a process control therefor, and the carrying between different operations can be performed in the configuration wherein the wafer is held on the supporting member to thereby enable avoiding wafer breakage during the carrying.

EXAMPLE

The present invention will further be illustrated below with reference to the following Examples which in no way limit the scope of the invention.

The following data carrier and data inputting/outputting device were employed:

data carrier: prepared by winding a copper wire of 0.2 mm diameter round a polyethylene terephthalate base material plate of 1 cm length, 3 cm width and 50 μm thickness to thereby obtain a 10-turns coil and connecting IC chip MIFARE ICS50 (manufactured by Phillips) to the coil; and interrogator: MIFARE EV500 (manufactured by Phillips).

Example 1

The data carrier was stuck onto a peripheral part of a glass plate of 150 mm diameter and 1 mm thickness with the use of a pressure sensitive adhesive double coated tape. A protective tape consisting of a 25 μm thick polyethylene terephthalate film coated with an acrylic pressure sensitive adhesive was stuck onto the surface of the data carrier. Thus, a semiconductor wafer supporting member as shown in FIG. 1 was obtained.

A 700 μm thick 5 inch semiconductor wafer having circuits formed thereon was secured onto the glass plate with the use of a pressure sensitive adhesive double coated tape consisting of a 25 μm thick base material of heat shrinkable polyethylene terephthalate having its both surfaces furnished with a 15 μm thick layer of ultraviolet curable pressure sensitive adhesive composed of 100 parts by weight of an acrylic pressure sensitive adhesive, 30 parts by weight of pentaerythritol triacrylate and 5 parts by weight of 1-hydroxycyclohexyl phenyl ketone.

Subsequently, process control information (i.e., thickness of finished semiconductor wafer: 100 μm, chip size: 2 mm×3 mm and dicing line spacing: 110 μm) was inputted through the interrogator into the data carrier.

Information required for back grinding and dicing was outputted from the data carrier, and back grinding and dicing were performed in accordance therewith. Thus, semiconductor wafer working according to the process control information could be accomplished.

Thereafter, the electrical characteristics of each individual chip were inspected after the dicing, and information on the drivability and durability of each individual chip was inputted in the data carrier.

The pressure sensitive adhesive double coated tape was irradiated with ultraviolet light from the glass plate side (illumination intensity: 160 W/cm), followed by heating at 100° C. The chips were picked up while retrieving the information on the drivability and durability of each individual chip from the data carrier. Thus, pickup according to the information could be carried out.

Example 2

A 5 inch semiconductor wafer having circuits formed thereon was secured onto a polycarbonate ring frame with the use of a pressure sensitive adhesive tape consisting of a polyethylene terephthalate base material having its one surface furnished with the same ultraviolet curable pressure sensitive adhesive layer as in Example 1.

Subsequently, the data carrier was stuck onto the ring frame, and a protective tape was stuck onto the surface of the data carrier.

The same information as in Example 1 was inputted through the data inputting/outputting device into the data carrier.

Information required for dicing was outputted from the data carrier, and the semiconductor wafer was diced in accordance therewith. Thus, dicing according to the information could be carried out.

What is claimed is:

1. A method of processing a semiconductor wafer, comprising the steps of:

securing a semiconductor wafer on which circuits are formed to a semiconductor wafer supporting member having an RF-memory;

inputting information regarding condition of the semiconductor wafer, quality of the circuits, and data required for process control of semiconductor wafer working in the RF-memory, wherein said semiconductor wafer working includes at least one step selected from grinding the semiconductor wafer at its back, dicing the semiconductor wafer and picking up semiconductor chips produced by the dicing; and conducting at least one step selected from grinding the semiconductor wafer at its back and dicing the semiconductor wafer while holding the wafer on the supporting member, and picking up semiconductor chips produced by the dicing, wherein said at least one step selected from grinding, dicing and picking up is conducted in accordance with the information obtained by reading the information from the RF-memory, which is inputted at the inputting step.

2. The method as claimed in claim 1, wherein the semiconductor wafer supporting member comprises a hard plate having the RF-memory secured thereupon.

3. The method as claimed in claim 1, wherein the semiconductor wafer supporting member comprises a hard plate having the RF-memory buried therein.

4. A semiconductor wafer supporting member which holds a wafer while the wafer is being ground or diced to separate the wafer into individual chips, or while the individual chips formed by dicing are picked up, comprising an RF-memory capable of memorizing information regarding condition of the wafer, quality of circuits formed on the wafer and data required for process control of semiconductor wafer working and having wafer securing ability.

5. The semiconductor wafer supporting member as claimed in claim 4, comprising a hard plate having the RF-memory secured thereupon.

6. The semiconductor wafer supporting member as claimed in claim 4, comprising a hard plate having the RF-memory buried therein.

7. The semiconductor wafer supporting member as claimed in claim 4, comprising a ring frame having the RF-memory secured thereupon.

8. The semiconductor wafer supporting member as claimed in claim 4, comprising a ring frame and a pressure sensitive adhesive sheet provided so that the pressure sensitive adhesive sheet is attached at its periphery to the ring frame, wherein the pressure sensitive adhesive sheet has the RF-memory stuck thereonto.

9. The semiconductor wafer supporting member as claimed in claim 4, wherein information regarding the condition of supported semiconductor wafer, the quality of circuits formed on a surface of semiconductor wafer and the data required for a process control of semiconductor wafer working is memorized in the RF-memory.

* * * * *